United States Patent [19]

Sigmon

[11] Patent Number: 5,786,727
[45] Date of Patent: Jul. 28, 1998

[54] MULTI-STAGE HIGH EFFICIENCY LINEAR POWER AMPLIFIER AND METHOD THEREFOR

[75] Inventor: Bernard Eugene Sigmon, Gilbert, Ariz.

[73] Assignee: Motorola, Inc., Schaumburg, Ill.

[21] Appl. No.: 730,045

[22] Filed: Oct. 15, 1996

[51] Int. Cl.⁶ .................................................. H03F 3/68
[52] U.S. Cl. ................................. 330/124 R; 330/295
[58] Field of Search ........................ 330/124 R, 286, 330/287, 295, 296

[56] References Cited

U.S. PATENT DOCUMENTS 3,579,136  5/1971  Machamer ........................ 330/296

OTHER PUBLICATIONS

"Efficiency of Doherty RF-Power Amplifier Systems" by Frederick H. Raab, Ph.D., from Green Mountain Radio Research Company, (Aug. 4, 1984).

Primary Examiner—James B. Mullins
Attorney, Agent, or Firm—Kevin K. Johanson

[57] ABSTRACT

A power amplifier (10) provides linear amplification of noise-like multi-carrier signals over a wide range of power levels. A power divider (40) divides an input signal for distribution in three amplifier networks (70, 72, 74) for selective amplification based upon input signal levels. Each amplifier network (70, 72, 74) is biased to respond when the efficiency of the previous stage diminishes. Successive staging of amplifier networks (70, 72, 74) broadens the efficiency bandwidth of power amplifier (10). A combiner (28) merges output signals from each successive amplifier networks to provide an improved efficiency output to a power amplifier (10) load.

19 Claims, 3 Drawing Sheets ial signal levels. Prior art amplifiers cannot
MULTI-STAGE HIGH EFFICIENCY LINEAR POWER AMPLIFIER AND METHOD THEREFOR

FIELD OF THE INVENTION

This invention relates in general to the field of linear power amplifiers, and more particularly to microwave power amplifiers for signals having multiple carrier frequencies.

BACKGROUND OF THE INVENTION

In satellite telecommunication systems, it is desirable for RF power amplifiers to linearly amplify RF signals in a highly efficient manner. However, there are tradeoffs between maximum efficiency and high linearity. Efficiency is generally proportional to input drive level, and high efficiency is usually not attained until an amplifier approaches its maximum output power, which is not consistent with linear operation. Doherty-type amplifiers, for example, achieve an efficiency advantage over standard class AB and class B amplifiers near peak power, in part, because of an instantaneous modulation of their carrier amplifier's loadline as the RF input level changes. In other words, Doherty-type amplifiers exhibit a more benign relationship between input drive level and efficiency because the amplifier's loadline is continuously modified to maintain high efficiency as input drive level changes. In addition, the bias power of Doherty-type amplifiers is greatly reduced over standard class AB and class B amplifiers.

High linearity is generally evidenced by a low level of non-linear intermodulation products. In many situations, the RF signals that need to be amplified in satellite telecommunication systems include multiple carrier frequencies spread over a large instantaneous bandwidth. The noise-like characteristics of these multiple-carrier signals make it difficult to amplify such signals in a linear fashion.

A key issue in operation of multi-carrier linear power amplifiers is the noise-like characteristic of the multiple carrier signals. In the case of single frequency linear power amplifiers, the power amplifier need only respond to constant or near constant envelopes. However, the RF amplitude envelope of noise-like multi-carrier signals changes in time according to the total occupied signal bandwidth. Multi-carrier linear power amplifiers should respond to this changing envelope in order to obtain high efficiency and linear operation. Therefore, there are additional network design requirements for multi-carrier linear power amplifiers above and beyond that of single frequency linear power amplifiers.

Thus what is needed is a multi-stage amplifier that improves the efficiency across a broader dynamic range than is possible with other amplifier configurations. What is also needed is an amplifier circuit that is suitable for applications, such as satellites, and portable transceivers that rely upon efficient power consumption techniques for feasible advanced communications. What is also needed is an amplifier circuit that is linear, efficient, has a low bias power level and is manufacturable.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein:

Figure 1:
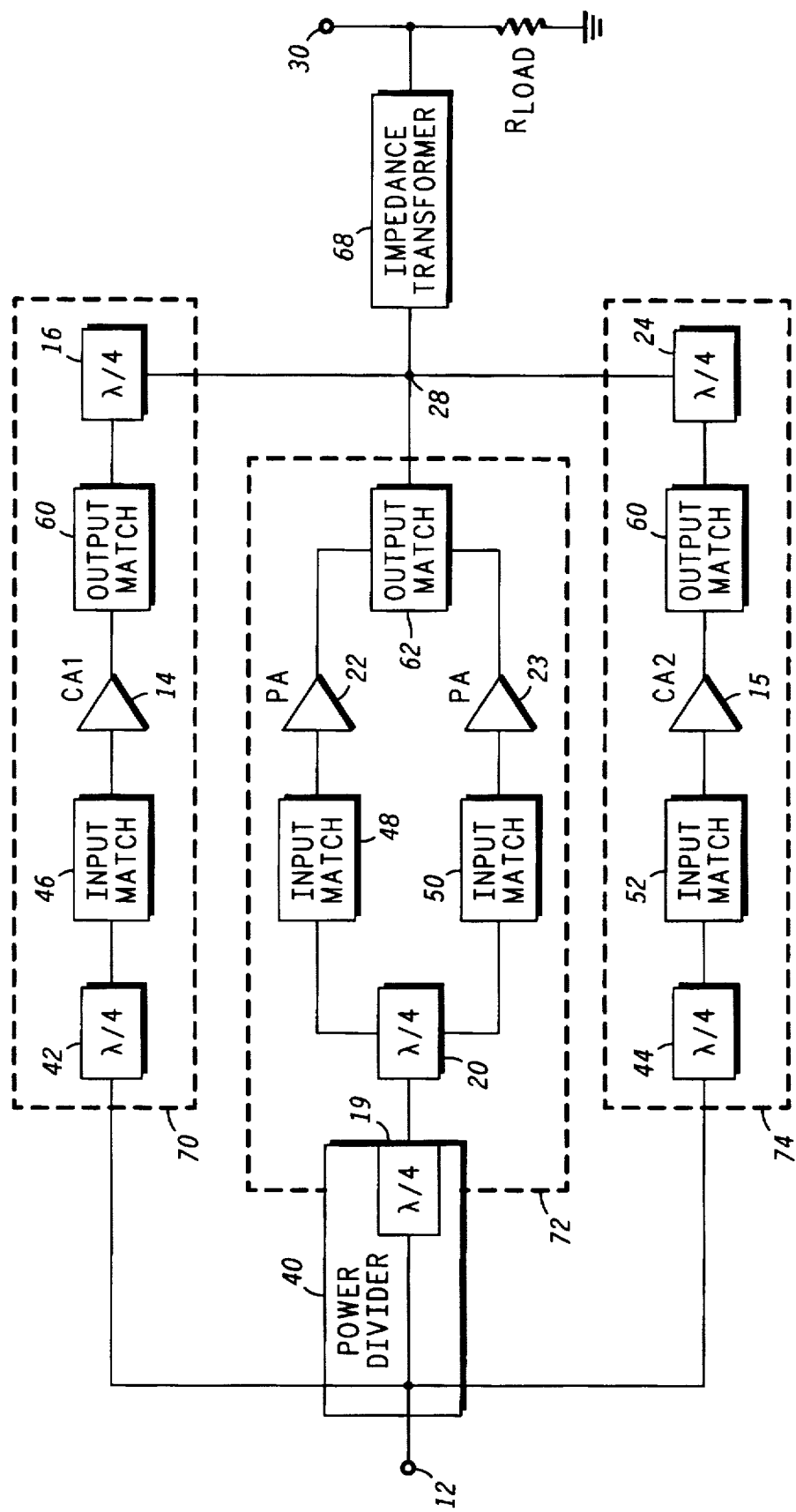
FIG. 1 shows a block diagram of a power amplifier in accordance with a preferred embodiment of the present invention.

The exemplification set out herein illustrates a preferred embodiment of the invention in one form thereof, and such exemplification is not intended to be construed as limiting in any manner.

DETAILED DESCRIPTION OF THE DRAWING

The present invention provides, among other things, a power amplifier that linearly amplifies noise-like multi-carrier signals over a wide range of power levels. The present invention also provides a low loss (i.e., good DC to RF efficiency) amplifier and method of amplification that achieves high DC to RF conversion efficiency over a wide range of input drive signal levels. Prior art amplifiers cannot simultaneously accomplish high efficiency and good linearity since their high efficiency point occurs when the amplifier is driven into saturation and the limiting process inherent to power saturated operation gives rise to significant intermodulation distortion products.

In the present invention, by using planar microstrip in a distributed topology, as opposed to lumped components, production costs are reduced and reliability improved due to fewer components, fewer wire bonds, and more manufacturably repeatable circuits.

FIG. 1 shows a block diagram of a power amplifier in accordance with a preferred embodiment of the present invention. Amplifier 10 includes input port 12 for receiving an RF input signal which could be amplitude or frequency modulated, or bauded such as quadrature phase shift keyed signal, or any combination of these, including multi-carrier input signals. Power divider 40, coupled to input port 12, is a three-way equal amplitude power splitter, in the preferred embodiment. Equivalent partitioning of the input signal results in a −5 dB signal level at the outputs of each of the three power divider output ports. Power divider 40, in the preferred embodiment, comprises two output ports, first carrier amplifier network port and second carrier amplifier network port, being in-phase with the input port and a third output port, peak amplifier network port, lagging the input port by a quarter of a wavelength due to a phase shifter 19. Each of the three power divider output ports distributes the input signal to a first carrier amplifier network 70, a second carrier amplifier network 74, and a peak amplifier network 72.

First carrier amplifier network 70 comprises a phase shifter 42 for shifting the signal from first carrier amplifier output port an additional one-quarter wavelength. Phase shifter 42 is preferably comprised of a transmission line of one-quarter wavelength in length at the operating frequency.

Second carrier amplifier network 74 comprises a phase shifter 44 for shifting the signal from second carrier amplifier output port an additional one-quarter wavelength. Phase shifter 44 is preferably comprised of a transmission line of one-quarter wavelength in length at the operating frequency.

Peak amplifier network 72 comprises a phase shifter 20 for shifting the signal from the peak amplifier output port an additional one quarter wavelength. In the preferred embodiment, phase shifter 20 further comprises a power splitter for providing an equal power split of the phase shifted signal from the peak amplifier output port of power divider 40. A power divider may be one of the known types of power dividers such as a Wilkenson power divider. Both of outputs from the power divider/phase shifter 20 are equal in phase and −3 dB down in additional signal level for a total of −8 dB in signal level relative to the signal level at input port 12. Input matching networks 46, 48, 50, and 52 impedance match the transmission lines with the input impedance of the corresponding amplifiers.

Referring back to first carrier amplifier network 70, a first carrier amplifier 14 is biased, in the preferred embodiment, as a class AB and amplifies when an input signal is present. First carrier amplifier 14 amplifies in the presence of "low" signal levels even as other amplifiers are biased off.

Referring to second carrier amplifier network 74, a second carrier amplifier 15 is biased as a class C and amplifies when an input signal higher than the minimum required for first carrier amplifier 14 is present. Second carrier amplifier 15 amplifies in the presence of "medium" signal levels such as at a level occurring when first carrier amplifier 14 is reaching or has reached saturation.

In peak amplifier network 72, a peak amplifier 22 is biased to amplify "high" power level signals such as those that occur when second carrier amplifier 15 has been amplifying and is approaching or has reached saturation. In the preferred embodiment, a peak amplifier 23 may be configured in parallel with peak amplifier 22 to provide additional signal power.

In the preferred embodiment, amplifiers 14, 15, 22, and 23 are Field Effect Transistors (FETs). The gate biasing is set such that in the presence of an input signal, when first carrier amplifier 14 begins amplifying, second carrier amplifier 15 and peak amplifiers 22 and 23 are biased off and exhibit a high impedance. Output matching networks 60, 62, and 64 impedance match the transmission lines with the outputs of the amplifiers.

In first carrier amplifier network 70, output matching network 60 from first carrier amplifier 14 couples to a phase shifter 16 providing both a one-quarter wavelength phase shift and an impedance inverter or transforming network. In the preferred embodiment, phase shifter 16 comprises a transmission line of one-quarter wavelength in length at the operating frequency. By phase shifting, the phase is aligned prior to combining all of the various outputs.

In second carrier amplifier network 74, output matching network 64 from second carrier amplifier 15 couples to a phase shifter 24 providing both a one-quarter wavelength phase shift and an impedance inverter or transforming network. As with phase shifter 16, phase shifter 24 comprises a transmission line of one-quarter wavelength in length at the operating frequency. Phase shifter 24 aligns the signal prior to combining.

In peak amplifier network 72, output matching network 62 combines outputs from both peak amplifiers 22 and 23 and present a combined signal to a common tie-point or combiner 28 for combining with outputs from phase shifters 16 and 24. All of the signals at combiner 28 are in-phase with each other and are driven to an impedance transformer 68 for matching with the load at an output 30. In the preferred embodiment, first carrier amplifier network 70, second carrier amplifier network 74, and peak amplifier network 72 are combined in a parallel manner. Because of the parallel configuration of multi-stages, devices in each of these stages may be replicated and be on the order of the same size of devices and therefore not susceptible to being overdriven by larger devices. The similar sizing of devices also contributes to matching and replication of devices as layed-out in substrates such as microstrip.

Impedance transformer 68 performs the function of transforming the load to the impedance equivalent of four devices effectively tied in parallel. For example, if the RF load is of impedance R then the output impedance transformer would transform the load R to R/N, where N is the number of equal impedances tied together.

The sequence of operation of amplifier 10 is as follows. First carrier amplifier 14 is biased to amplify in the presence of an input RF signal with both second carrier amplifier 15 and peak amplifiers 22 and 23 being biased off and ideally presenting a high impedance to combiner 28 thus not unduly loading the circuit at combiner 28. Second carrier amplifier 15 is biased such that as first carrier amplifier 14 approaches saturation, second carrier amplifier 15 turns on because of the increased input signal drive level. When operative, second carrier amplifier 15 augments the output drive level of first carrier amplifier 14 as seen at output 30. An increased output voltage generated by operative second carrier amplifier 15 appears as an impedance increase at combiner 28.

Phase shifter 16 with its impedance transforming properties, reduces the load presented to first carrier amplifier 14 due to the impedance inverting properties of a one-quarter wavelength transmission line. By reducing the load, an improved power match with first carrier amplifier 14 is obtained. First carrier amplifier 14 continues to amplify the RF input power rather than hard limit.

Once second carrier amplifier 15 approaches saturation, peak amplifiers 22 and 23 are biased to be driven into conduction. In the preferred embodiment, the gate bias of peak amplifiers 22 and 23 are set to insure power is added by these amplifiers at the designated input drive level. An increase in the output voltage generated by operative peak amplifiers 22 and 23 appears at combiner 28 and is impedance matched to the load by impedance transformer 68 to generate output 30.

Figure 2:
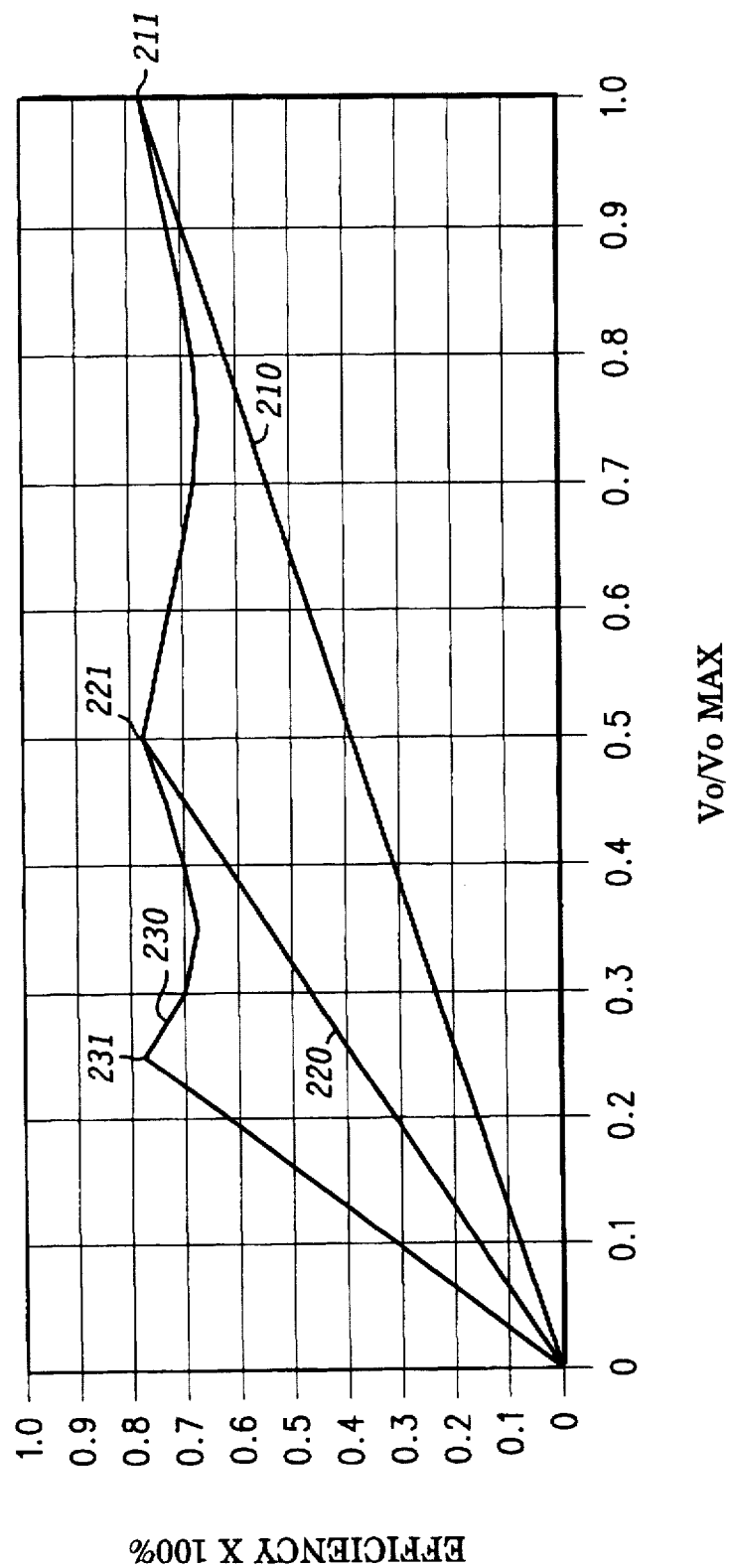
FIG. 2 shows a graph of efficiency comparisons of a multi-stage power amplifier in accordance with a preferred embodiment of the present invention.

FIG. 2 shows a graph of efficiency comparisons of a multi-stage power amplifier in accordance with a preferred embodiment of the present invention. The graph shows a plot of RF output power and efficiency as a function of input RF power. A class F amplifier was analyzed and plotted as class F amplifiers are capable of efficiencies approaching 85%. Those skilled in the art recognize that class F amplifiers short circuit the even harmonics and open circuit the odd harmonics. Such conditioning generates a rectangular voltage waveform at the drain of active devices. Other classes of amplifiers could also be employed such as class E, class B, class C, and others known by those of skill in the art.

A class B curve 210 illustrates an ideal class B amplifier waveform depicting approximately linear efficiency. It should be noted that for small Vo/Vomax ratios, the efficiency levels are very low and linearly increase to a saturation point. However, through appropriate biasing, the slope of the gain may be adjusted to provide earlier saturation, thus improving the efficiency rate for smaller signals.

By adding additional stages, an amplifier curve may be adjusted to improve efficiencies over a broader range of input signal levels. A 2-stage Doherty curve 220 illustrates a first stage saturating at a saturation point 221 followed by an expected drop off in efficiency for an increase in Vo. As Vo increases, a second stage is biased to turn on and the efficiency begins to increase again to a second saturation point shown corresponding to saturation point 211. The overall efficiency has been improved for a broader range of signals, however, low level input signals still result in low efficiency over low Vo signals.

To improve the overall efficiency of amplifier 10 for multi-carrier input signals. A multi-stage curve 230 illustrates an improvement by enhancing the amplifier efficiency for lower Vo/Vomax ratios. A first stage saturates at a saturation point 231 with the efficiency dropping off thereafter. As the Vo level increases, a second stage turns on and because it is not yet saturated, the efficiency of the overall multi-stage amplifier begins to improve as shown. As the second stage saturates at saturation point 221, the overall efficiency of the multi-stage amplifier decreases and a subsequent third stage begins to turn on and recover the efficiency. In the present invention, the improvement in efficiency of amplifier 10 is shown as the increase in area between 2-stage Doherty curve 220 and multi-stage curve 230.

Figure 3:
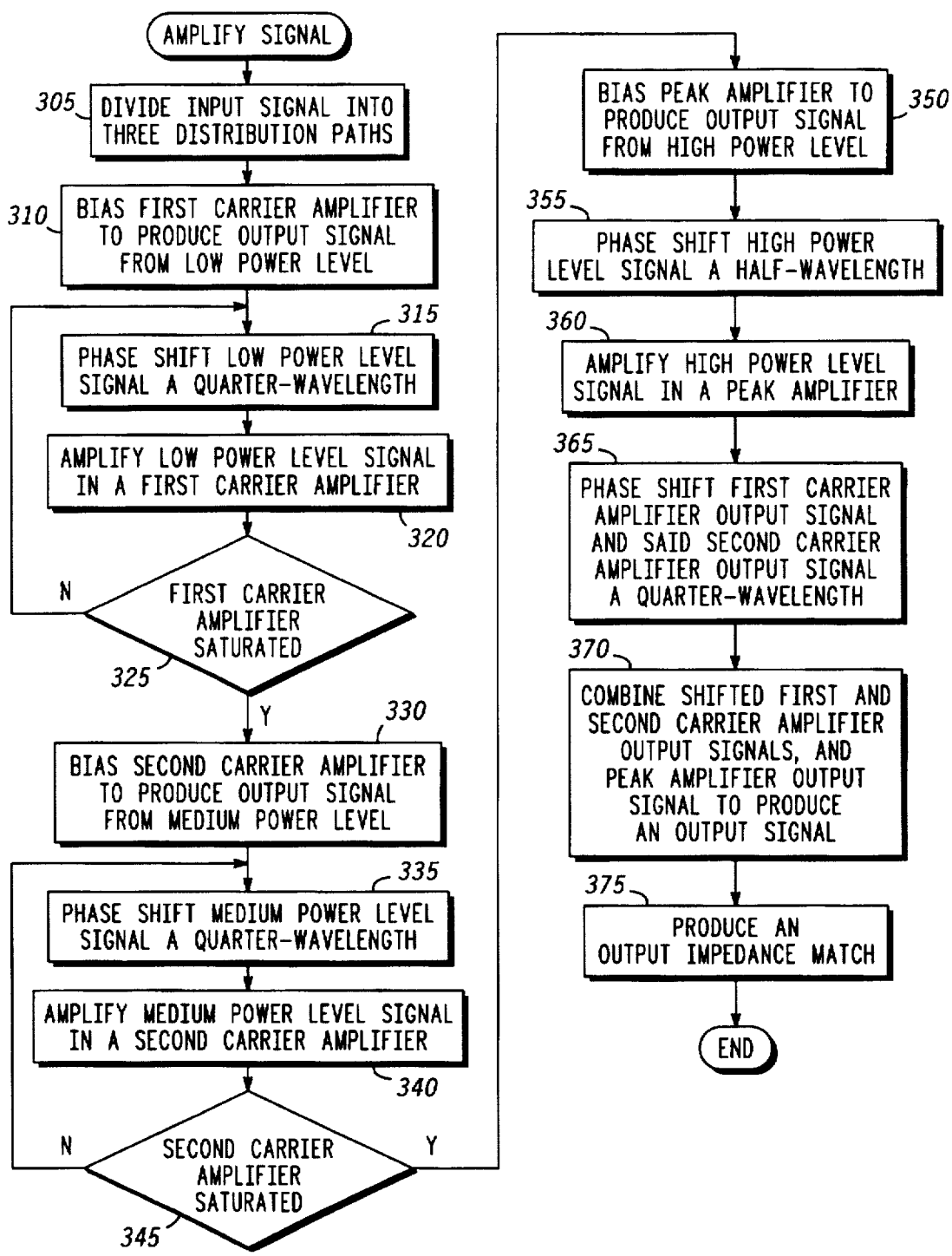
FIG. 3 is a flowchart of a method of amplifying a signal in accordance with an embodiment of the present invention.

FIG. 3 is a flowchart of a method of amplifying a signal in accordance with an embodiment of the present invention. An amplify signal process amplifies signals having low, medium and high power levels to enhance the efficiency of overall performance of the amplifier.

A task 305 power divides the input signal into three separate distribution paths to the first carrier amplifier, the second carrier amplifier, and the peak amplifier. This preferably is performed by a power divider circuit such as power divider 40 (FIG. 1).

A task 310 biases the first carrier amplifier to produce a first carrier amplifier output signal when the input signal has a low power level. Bias circuits are known by those of skill in the art for setting an amplification threshold for the first carrier amplifier.

A task 315 phase shifts the signal having the low power level a quarter-wavelength to produce a first carrier amplifier input signal. Phase shifters may be a quarter-wavelength transmission line known by those of skill in the art.

A task 320 amplifies the first carrier amplifier input signal in the first carrier amplifier to produce a first carrier amplifier output signal. A query task 325 determines when the first carrier amplifier is saturated. When saturation has not yet occurred, amplification continues at an efficient level.

When saturation has occurred or is soon to occur, a task 330 biases the second carrier amplifier to produce the second carrier amplifier output signal when the signal has said medium level. A task 335 phase shifts the signal having a medium power level of the signal a quarter-wavelength to produce a second carrier amplifier input signal.

A task 340 amplifies the second carrier amplifier input signal in a second carrier amplifier to produce a second carrier amplifier output signal. A query task 345 determines if the second carrier amplifier is saturated. When the second carrier amplifier is not saturated, processing returns to task 335 where signals are continued to be phase shifted and efficiently amplified.

When the second carrier amplifier is saturated or nearly saturated, a task 350 biases the peak amplifier to produce the peak amplifier output signal when the signal has a high power level. It should be noted that biasing of each amplifier may be performed in parallel and in a hardware implementation, biasing of amplifiers is ongoing upon applying power to the circuit.

A task 355 phase shifts the signal having the high power level of the input signal a half-wavelength to produce a peak amplifier input signal. A task 360 amplifies the peak amplifier input signal in a peak amplifier to produce a peak amplifier output signal.

A task 365 phase shifts the first carrier amplifier output signal and the second carrier amplifier output signal a quarter-wavelength to produce a shifted first carrier amplifier output signal and a shifted second carrier amplifier output signal. A task 370 combines the shifted first carrier amplifier output signal, the shifted second carrier amplifier output signal, and the peak amplifier output signal to produce an output signal. A task 375 produces a predetermined output impedance match for the first carrier amplifier, the second carrier amplifier, and the peak amplifier to provide an output signal to the load.

While the embodiments discussed above are preferably fabricated on Gallium Arsenide, any or all component may be built using lumped elements.

Thus a power amplifier has been described that is able to handle noise-like multi-carrier signals and is able to operate efficiently over a wide range of signal power levels. This power amplifier is suitable for use in portable devices requiring efficiency for prolonged performance. Such uses include portable telecommunications such as cellular telephones, and satellite communications employing multiple carrier frequencies spread over a large instantaneous bandwidth.

The present invention incorporates a topology that efficiently achieves the combined output power capable from four active devices. Typically, a 2-stage Doherty amplifier combines four devices together would have required power combiners with equal splits power combiners on the input and output of the two individual Doherty amplifiers. The present invention accomplishes the successful power combining of four active devices without the use of a power combiner to tie two individual Doherty amplifiers together, thus foregoing the circuit losses associated with passive power combiner.

Additionally, the present invention sequences the initialization of each respective power combining operation in such a manner as to optimize and improve on the high efficiency operating range achievable from the active devices when compared to the prior art.

Thus, a power amplifier circuit for amplifying signals comprising a first and second carrier amplifiers and a peak amplifiers has been disclosed. Also, a method for amplifying signals having a spectrum of input signal levels has been disclosed for improving the overall efficiency of a power amplifier.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:
1. A power amplifier, comprising:
 a first carrier amplifier network including:
   (a) a first carrier amplifier for amplifying input signals and producing first carrier signals;
   (b) a first impedance transforming network coupled to an output of said first carrier amplifier;
   (c) a first phase shifter coupled to said first impedance transforming network for phase shifting said first carrier signals one quarter wavelength; and

(d) a second phase shifter coupled to an input of said first carrier amplifier for phase shifting said input signals a quarter wavelength;

a second carrier amplifier network including:

(e) a second carrier amplifier for amplifying input signals and producing second carrier signals;

(f) a second impedance transforming network coupled to an output of said second carrier amplifier;

(g) a third phase shifter coupled to said second impedance transforming network for phase shifting said second carrier signals one quarter wavelength; and (h) a fourth phase shifter coupled to an input of said second carrier amplifier for phase shifting said input signals a quarter wavelength;

a peak amplifier network including:

(i) a first peak amplifier for amplifying said input signals and producing peak signals; and (j) a fifth phase shifter coupled to an input of said first peak amplifier for phase shifting said input signals a half wavelength; and a combiner for in-phase combining said first carrier signals, said second carrier signals, and said peak signals to produce an output signal.

2. The power amplifier as claimed in claim 1 wherein said first carrier amplifier is configured to provide amplification of said input signals at low power levels, and wherein said second carrier amplifier is biased to provide amplification of said input signals at medium power levels, and wherein said first peak amplifier is biased to provide amplification of said input signals at high power levels.

3. The power amplifier as claimed in claim 2 wherein said medium power levels coincide with saturation of said first carrier amplifier and said high power levels coincide with saturation of said second carrier amplifier.

4. The power amplifier as claimed in claim 1 wherein said peak amplifier network further comprises a second peak amplifier coupled in parallel with said first peak amplifier for further producing said peak signals.

5. The power amplifier as claimed in claim 1 wherein said fifth phase shifter is comprised of a sixth phase shifter and a seventh phase shifter.

6. The power amplifier as claimed in claim 5, further comprising a power divider for dividing said input signals for in-phase distribution to said first carrier amplifier network, and said second carrier amplifier network, and for phase-shifted distribution to said sixth phase shifter in said peak amplifier network.

7. The power amplifier as claimed in claim 1 wherein said combiner comprises a reactive combiner.

8. The power amplifier as claimed in claim 1, further comprising output matching circuits coupled between said first carrier amplifier, said second carrier amplifier, said first peak amplifier and said first impedance transforming network, said second impedance transforming network, said combiner, respectively, said output matching circuits for providing impedance matching of said first carrier amplifier network, said second carrier amplifier network, and said peak amplifier network.

9. The power amplifier as claimed in claim 8, wherein said output matching circuits are comprised of parallel coupled microstrip lines.

10. A power amplifier, comprising:

a first carrier amplifier configured to amplify low signal levels of a quarter-wavelength phase shifted input signal;

a first quarter-wavelength transmission line coupled to the output of said first carrier amplifier;

a second carrier amplifier configured to amplify medium signal levels of said quarter-wavelength phase shifted input signal;

a second quarter-wavelength transmission line coupled to the output of said second carrier amplifier;

a peak amplifier configured to amplify high signal levels of a half-wavelength phase shifted input signal; and a combiner for in-phase combining output signals of said first and second quarter-wavelength transmission lines and said peak amplifier.

11. The power amplifier as recited in claim 10, further comprising:

a first biasing means for configuring said first carrier amplifier to produce a first carrier amplifier output signal from said low signal levels;

a second biasing means for configuring said second carrier amplifier to produce a second carrier amplifier output signal from said medium signal levels; and a peak biasing means for configuring said peak amplifier to produce a peak amplifier output signal from said high signal levels.

12. The power amplifier as recited in claim 10, further comprising a power divider for dividing an input signal into three separate paths distribution to said first carrier amplifier, said second carrier amplifier, and said peak amplifier.

13. The power amplifier as recited in claim 10, further comprising an output impedance matching means coupled between outputs of said first carrier amplifier, said second carrier amplifier, said peak amplifier and said combiner for matching impedances of said first carrier amplifier output signal, said second carrier amplifier output signal, and said peak amplifier output signal.

14. A method of amplifying a signal of low, medium, and high power level, comprising the steps of:

phase shifting said signal having said low power level a quarter-wavelength to produce a first carrier amplifier input signal;

amplifying said first carrier amplifier input signal in a first carrier amplifier to produce a first carrier amplifier output signal;

phase shifting said signal having said medium power level a quarter-wavelength to produce a second carrier amplifier input signal;

amplifying said second carrier amplifier input signal in a second carrier amplifier to produce a second carrier amplifier output signal;

phase shifting said signal having said high power level a half-wavelength to produce a peak amplifier input signal;

amplifying said peak amplifier input signal in a peak amplifier to produce a peak amplifier output signal;

phase shifting said first carrier amplifier output signal and said second carrier amplifier output signal a quarter-wavelength to produce a shifted first carrier amplifier output signal and a shifted second carrier amplifier output signal; and combining said shifted first and second carrier amplifier output signals, and said peak amplifier output signal to produce an output signal.

15. The method as recited in claim 14, further comprising the steps of:

biasing said first carrier amplifier to produce said first carrier amplifier output signal for said low power level;

biasing said second carrier amplifier to produce said second carrier amplifier output signal for said medium power level; and biasing said peak amplifier to produce said peak amplifier output signal for said high power level.

16. The method as recited in claim 15, further comprising the steps of:

prior to said amplifying said second carrier amplifier input signal step, saturating said first carrier amplifier; and prior to said amplifying said peak amplifier input signal step, saturating said second carrier amplifier.

17. The method as recited in claim 16 further comprising the step of power dividing said signal into three separate distribution paths to said first carrier amplifier, said second carrier amplifier, and said peak amplifier.

18. The method as recited in claim 14, further comprising the step of producing a predetermined output impedance match for said first carrier amplifier, said second carrier amplifier, and said peak amplifier.

19. The method as recited in claim 14, wherein said amplifying said peak amplifier input signal step further comprises the step of providing a second peak amplifier for augmenting said peak amplifier output signal.

* * * * *